US008648615B2

(12) United States Patent
Rahman (10) Patent No.: US 8,648,615 B2
(45) Date of Patent: Feb. 11, 2014

(54) TESTING DIE-TO-DIE BONDING AND REWORK

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 811 days.

(21) Appl. No.: 12/824,536

(22) Filed: Jun. 28, 2010

(65) Prior Publication Data

US 2011/0316572 A1 Dec. 29, 2011

(51) Int. Cl.
*G01R 31/20* (2006.01)

(52) U.S. Cl.
USPC ............ 324/754.09; 324/754.03; 324/754.01; 324/757.05

(58) Field of Classification Search
USPC ........................................ 324/754.09, 754.08
See application file for complete search history.

(56) References Cited

U.S. PATENT DOCUMENTS

| | | | | |
|---|---|---|---|---|
| 4,489,364 | A * | 12/1984 | Chance et al. ................. | 361/737 |
| 5,353,498 | A * | 10/1994 | Fillion et al. .................... | 29/840 |
| 5,754,410 | A * | 5/1998 | Bardsley et al. ............... | 361/777 |
| 5,815,427 | A * | 9/1998 | Cloud et al. .................... | 365/51 |
| 6,833,626 | B2 * | 12/2004 | Kajiwara et al. ............... | 257/777 |
| 6,914,259 | B2 * | 7/2005 | Sakiyama et al. .............. | 257/48 |
| 7,414,422 | B2 * | 8/2008 | Aoyagi et al. ........... | 324/750.22 |
| 7,626,411 | B2 * | 12/2009 | Shimizume et al. ..... | 324/762.06 |
| 7,683,607 | B2 * | 3/2010 | Cheng et al. ............ | 324/762.06 |
| 7,843,206 | B2 * | 11/2010 | Hyobu ....................... | 324/750.3 |
| 7,973,310 | B2 * | 7/2011 | Wang et al. ..................... | 257/48 |
| 2003/0085461 | A1 | 5/2003 | Sakiyama et al. | |
| 2006/0232292 | A1 * | 10/2006 | Shimizume et al. .......... | 324/765 |
| 2008/0197872 | A1 | 8/2008 | Matsushima | |
| 2009/0058435 | A1 * | 3/2009 | Nakamura .................... | 324/719 |
| 2009/0096478 | A1 | 4/2009 | Keeth | |
| 2010/0007001 | A1 * | 1/2010 | Wang et al. .................... | 257/686 |

FOREIGN PATENT DOCUMENTS

| | | |
|---|---|---|
| EP | 1 580 812 A2 | 9/2005 |
| WO | WO 2007/077849 A1 | 7/2007 |

OTHER PUBLICATIONS

Lewis, Dean L. et al., "Testing Circuit-Partitioned 3D IC Designs," *Proc. of the 2009 IEEE Computer Society Annual Symposium on VLSI*, May 13, 2009, IEEE, Piscataway, New Jersey, USA.

* cited by examiner

*Primary Examiner* — Richard Isla Rodas
(74) *Attorney, Agent, or Firm* — Kevin T. Cuenot; LeRoy D. Maunu; Lois D. Cartier (57) ABSTRACT

A method of testing a multi-die integrated circuit (IC) can include testing an inter-die connection of the multi-die IC. The inter-die connection can include a micro-bump coupling a first die to a second die. The method can include detecting whether a fault occurs during testing of the inter-die connection. Responsive to detecting the fault, the multi-die integrated circuit can be designated as including a faulty inter-die connection. Also described is an integrated circuit that includes a first die, a second die on which the first die may be disposed, a plurality of inter-die connections coupling the first die to the second die, and a plurality of probe pads, where each probe pad is coupled to at least one of the inter-die connections.

16 Claims, 4 Drawing Sheets

TESTING DIE-TO-DIE BONDING AND REWORK

FIELD OF THE INVENTION

One or more embodiments disclosed within this specification relate to integrated circuits (ICs). More particularly, one or more embodiments relate to testing ICs that include multiple dies.

BACKGROUND

The probability that a flaw will occur in a die when manufacturing an integrated circuit (IC) generally increases as the size of the die used to implement the IC increases. The occurrence of a manufacturing flaw, also referred to as a "fault," within an IC can result in a reduction, or complete failure, in the operability of the IC. For this reason, it can be more cost effective to implement an IC in the form of a multi-die IC as opposed to a single, monolithic die.

A multi-die IC, in general, is formed using a plurality of dies coupled together and disposed within a single package. A manufacturing fault occurring within any one of the dies of a multi-die IC renders only that die inoperable. Thus, within a multi-die IC, a manufacturing fault renders less die area unusable than when a fault occurs within an IC formed of a single, larger die.

While the use of multi-die ICs can increase yield with respect to the final product, multi-die ICs still must undergo thorough testing. For example, the connectivity among the different dies that are combined to form the multi-die IC structure must be robust and reliable. Otherwise, the entire multi-die IC, referring to each constituent die, becomes unusable.

SUMMARY

One or more embodiments disclosed within this specification relate to integrated circuits (ICs) and, more particularly, to testing ICs that include multiple dies. One or more embodiments can include a method of testing a multi-die IC. The method can include testing an inter-die connection of the multi-die IC, wherein the inter-die connection includes a micro-bump coupling a first die to a second die. The method also can include detecting whether a fault occurs during testing of the inter-die connection. Responsive to detecting the fault, the multi-die IC can be designated as including a faulty inter-die connection.

The method can include selecting the second die to be an interposer consisting essentially of at least one passive metal layer.

Testing the inter-die connection can include providing a first probe pad disposed on top of the second die, wherein the first probe pad is coupled to a first micro-bump coupling the first die to the second die. A second probe pad can be provided and disposed on top of the second die. The second probe pad can be coupled to a second micro-bump coupling the first die to the second die. The method can include, within the first die, establishing an internal connection coupling the first micro-bump to the second micro-bump.

Detecting whether a fault occurs can include determining whether a test signal propagates from the first probe pad to the second probe pad.

Testing the inter-die connection also can include disposing the first die on top of the second die, wherein the second die includes a first through silicon via (TSV) coupled to the first die through a first micro-bump and a second TSV coupled to the first die through a second micro-bump. Within the first die, an internal connection can be established coupling the first micro-bump to the second micro-bump.

Detecting whether a fault occurs can include determining whether a test signal provided to the first TSV propagates to the second TSV.

In one or more aspects, the first TSV can be coupled to the first micro-bump at a first end of the first TSV and can be coupled to a first package bump at a second end of the first TSV. The second TSV can be coupled to the second micro-bump at a first end of the second TSV and coupled to a second package bump at a second end of the second TSV. Accordingly, detecting whether a fault occurs can include determining whether a test signal provided to the first package bump propagates to the second package bump.

Testing the inter-die connection further can include providing a first probe pad and a second probe pad disposed on top of the second die. The first probe pad can be coupled to the first TSV. The second probe pad can be coupled to the second TSV.

Testing the inter-die connection also can include providing a first probe pad disposed on top of the second die. The first probe pad can be coupled to a first micro-bump. A TSV can be provide within the second die. A first end of the TSV can be coupled to a second micro-bump. Within the first die, an internal connection can be established coupling the first micro-bump to the second micro-bump.

Detecting whether a fault occurs further can include determining whether a test signal propagates from the first probe pad to the TSV.

The first die can be bonded to the second die using a semi-permanent bonding technique. In that case, when the multi-die integrated circuit is designated as including a faulty inter-die connection, the inter-die connection can be re-processed.

One or more other embodiments can include an IC. The IC can include a first die, a second die, and a plurality of inter-die connections coupling the first die to the second die. The IC also can include a plurality of probe pads, wherein each probe pad is coupled to an inter-die connection.

In one or more aspects, the plurality of probe pads can be distributed along at least one edge of the second die. In one or more other aspects, the plurality of probe pads can be distributed along each edge of the second die and encompass the first die.

The first die can be disposed on top of the second die. Accordingly, the IC can include a third die disposed on top of the second die. The first die and the third die can be in substantially a same horizontal plane. At least one of the probe pads can be located between the first die and the third die.

One or more other embodiments can include an IC having a first die and a second die, wherein the first die is stacked on top of the second die. The IC can include a plurality of inter-die connections, wherein each inter-die connection includes a micro-bump disposed between the first die and the second die that couples the first die to the second die. The IC can include a first probe pad disposed on top of the second die, wherein the first probe pad can be coupled to a first micro-bump. The IC can include a second probe pad disposed on top of the second die, wherein the second probe pad can be coupled to a second micro-bump. The first die can be configured to establish an internal connection coupling the first micro-bump to the second micro-bump.

In one or more aspects, the internal connection can be fixed. In one or more other aspects, the internal connection can be formed using programmable circuitry of the second die by loading configuration data into the first die.

The first die can be bonded on top of the second die using a semi-permanent bonding technique. For example, the first die can be permanently bonded to the second die only after determining that the plurality of inter-die connections are fault free.

One or more of the plurality of inter-die connections can include a TSV within the second die. A first end of the TSV can be coupled to the first micro-bump. A second end of the TSV can extend through the second die to a surface of the second die opposite a surface upon which the first and second probe pads are disposed. The first probe pad can couple to the first micro-bump using the TSV.

DETAILED DESCRIPTION

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to testing ICs that include multiple dies (referred to herein as "multi-die ICs"). In accordance with one or more embodiments disclosed within this specification, the physical connections that facilitate communication between dies of a multi-die IC can be tested. Various testing techniques are disclosed that facilitate testing of inter-die connections and the identification of faulty inter-die connections. Circuit structures are also disclosed that facilitate testing of the inter-die connections.

Conventional multi-die ICs are usually formed using small sized dies. In consequence, the number of inter-die connections that are formed when the dies are bonded together is typically small enough that the inter-die connections are not tested. For example, conventional multi-die ICs are constructed using small die sizes that are joined through only a limited number of inter-die connections. In such cases, independent testing of the inter-die connections and structures used to create the inter-die connections is not performed because the cost of each individual die is so small that the cost of even the entire multi-die IC is of little consequence should one need to be discarded due to faults in the inter-die connections.

When multi-die ICs are created using larger, more expensive die sizes, however, discarding even a single die in consequence of a faulty inter-die connection can be costly since two or more larger and more expensive dies that are known to be good or fault free are effectively discarded. Moreover, the number of inter-die connections that are formed when bonding two or more larger dies together to form a multi-die IC is significantly larger. The larger number of inter-die connections merits the added time and expense of testing. For example, with larger die sizes, the number of inter-die connections can be approximately 100 times that typically found in smaller, conventional multi-die ICs.

Figure 1:
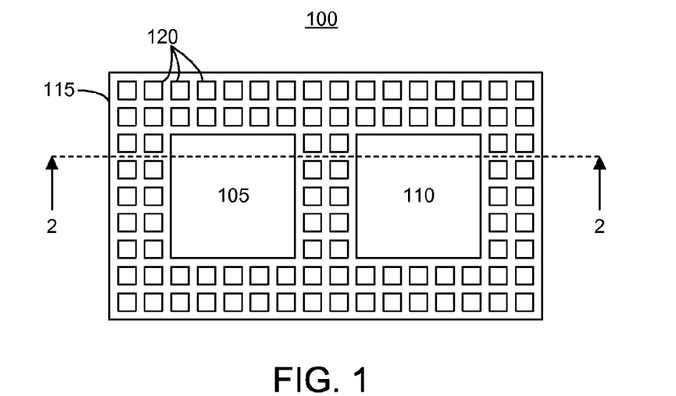
FIG. 1 is a first block diagram illustrating a multi-die integrated circuit (IC) in accordance with one or more embodiments disclosed within this specification.

FIG. 1 is a first block diagram illustrating a multi-die IC 100 in accordance with one or more embodiments disclosed within this specification. As shown, multi-die IC 100 includes die 105 and die 110 disposed on a top surface of an interposer 115. For example, die 105 and die 110 can be in direct physical contact with interposer 115 or can be coupled through one or more intervening IC manufacturing process layers that can include one or more circuit structures.

Each of dies 105 and 110 can implement any of a variety of different types of circuits or chips. For example, each of dies 105 and 110 can be implemented as a memory, a processor, or a programmable IC. In another example, die 105 can implement a memory and die 110 can implement a processor or a programmable IC. In still another example, one or both of dies 105 and 110 can implement application specific ICs or a mixed signal IC. The examples presented are for purposes of illustration and are not intended to limit the one or more embodiments disclosed within this specification.

Programmable ICs are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuits and programmable logic circuits are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology.

The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic. Referring to FIG. 1, die 105, die 110, or both dies 105 and 110, for example can be implemented as a programmable IC.

Continuing with FIG. 1, interposer 115 can communicatively link die 105 and die 110 by coupling selected pads of die 105 with selected pads of die 110. A connection between die 105 and die 110, in this case facilitated by interposer 115, can be referred to as an inter-die connection. An inter-die connection refers to a signal path that begins in a first die and traverses a boundary between the first die and a second die. The inter-die connection can traverse further boundaries between dies, whether continuing into a third die or looping back from the second die to the first die. In traversing a boundary between two dies, whether the boundary is formed between die 105 and die 110, between die 105 and interposer 115, between die 110 and interposer 115, or any other combination thereof, the inter-die connection includes the particular circuit structure used to communicatively link the two dies.

For purposes of illustration, only two dies are shown on top of interposer 115. The one or more embodiments described within this specification, however, are not intended to be limited by the number of dies disposed upon interposer 115. For example, three or more dies can be disposed on top of interposer 115. Further, other multi-die configurations can be used as will be described within this specification in greater detail.

Multi-die IC 100 further can include a plurality of probe pads 120. Each of probe pads 120 can be disposed on interposer 115. The connectivity of different ones of probe pads 120 will be described in greater detail with reference to the remaining figures. Probe pads 120 can be distributed on a top surface of interposer 115. As illustrated, probe pads 120 are disposed on the same surface upon which die 105 and die 110 are disposed. Accordingly, die 105, die 120, and probe pads 120 can be implemented substantially within a same horizontal plane that is parallel to the top surface of interposer 115. Probe pads 120 can be arranged in a variety of different configurations including, for example, being disposed around the outer edge of interposer 115, e.g., surrounding each of dies 105 and 110, and between dies 105 and 110.

It should be appreciated that while probe pads 120 are shown as being distributed across the top surface of interposer 115, probe pads 120 can be distributed in a more limited fashion. For example, probe pads 120 can be distributed along only one edge of interposer 115, along only two edges of interposer 115, along only three edges of interposer 115, or along all four edges of interposer 115. In each of these examples, probe pads 120 can be located between die 105 and die 110 or not.

The existence of probe pads 120 upon interposer 115 does not preclude the use of additional probe pads (not shown) upon die 105 and/or die 110 or additional probe pads (not shown) dedicated for testing selected features solely within interposer 115, e.g., features other than inter-die connections. Such probe pads, however, are considered to be a separate class of probe pads, and thus, independent of probe pads 120, which facilitate more direct testing of inter-die connections.

In one or more embodiments, the distribution of probe pads 120 across interposer 115 can improve power distribution in multi-die IC 100. Within larger dies, for example, when power is supplied from the periphery of the die, a voltage drop can be seen from the periphery of the die to the center of the die. The distribution of probe pads 120 can reduce the size of the voltage drop seen across each of the dies, e.g., across die 105 and/or die 110. The addition of probe pads 120 on the periphery of interposer 115, with power and ground grids coupled to probe pads 120, can reduce the effective resistance from pad to transistor in multi-die IC 100. Reduction in effective resistance translates into less voltage drop from pad to transistor.

Figure 2:
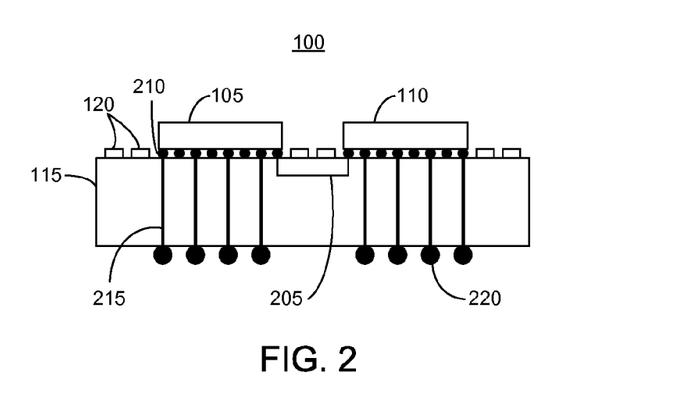
FIG. 2 is a first cross-sectional side view of a multi-die IC in accordance with one or more other embodiments disclosed within this specification.

FIG. 2 is a first cross-sectional side view of a multi-die IC in accordance with one or more other embodiments disclosed within this specification. FIG. 2 illustrates multi-die IC 100 of FIG. 1 in cross-section taken along cut-line 2 of FIG. 1. Accordingly, like numbers will be used to refer to the same items throughout this specification.

Interposer 115 can be implemented as a die formed of one or more layers of an IC manufacturing process. Interposer 115 can include at least one metallization layer, but can include a plurality of metallization layers separated by appropriate insulating or non-conductive layers. The metallization layer, or layers as the case may be, implements inter-die wires 205 that couple selected pads of die 105 to selected pads of die 110.

In one or more embodiments, interposer 115 can be configured as an entirely passive structure within which inter-die wires 205 are implemented. In one or more other embodiments, interposer 115 can include one or more active devices and, thus, be considered an active structure. The one or more embodiments described within this specification are not intended to be limited to either passive or active interposers. In one or more embodiments, interposer 115 can be considered a third die reserved for implementing the necessary signaling between dies 105 and 110.

Die 105 and die 110 can be coupled to interposer 115 through a plurality of micro bumps 210. Micro bumps 210 generally are solder balls that electrically couple pads (not shown) of each of dies 105 and 110 to pads (not shown) of interposer 115. The pads of interposer 115 coupled to micro bumps 210 can couple to inter-die wires 205 or through silicon vias (TSVs) 215. Inter-die wires 205 are effectively long interconnect lines within interposer 115 that couple different dies. For example, inter-die wires 205 can couple one or more pads of die 105 with one or more pads of die 110. As shown, inter-die wires 205 can be disposed beneath the top surface, e.g., within, interposer 115.

Each TSV 215, in contrast to a vertical portion of each inter-die wire 205, can extend completely through interposer 115 extending from a pad disposed immediately below the top surface of interposer 115 through to a pad exposed through the bottom surface of interposer 115. Each TSV 215 can couple a pad of one of dies 105 or 110, via a micro bump 210, for example, to one of the plurality of package bumps 220. Package bumps 220, also referred to as "C4 bumps," generally are solder balls that couple pads on the bottom portion of interposer 115 to the package of multi-die IC 100, and thus, to external pins of the package. One or more pads of die 105 and one or more pads of die 110 can be coupled to external pins of the package of multi-die IC 100 by coupling the pads to micro bumps 210, to TSVs 215, to package bumps 220, and to external package pins.

Die 105, die 110, and interposer 115 can be manufactured separately, e.g., each as part of its own distinct wafer. Die 105, die 110, and interposer 115 can be tested while still in wafer form, e.g., prior to dicing and prior to bonding die 105 and die 110 to the top surface of interposer 115. Testing while still in wafer form ensures that known bad dies are not used in implementing multi-die IC 100. Thus, die 105 and die 110 each is a "known good die." Only dies that are determined via testing to be known good dies can be bonded to an interposer.

Figure 3:
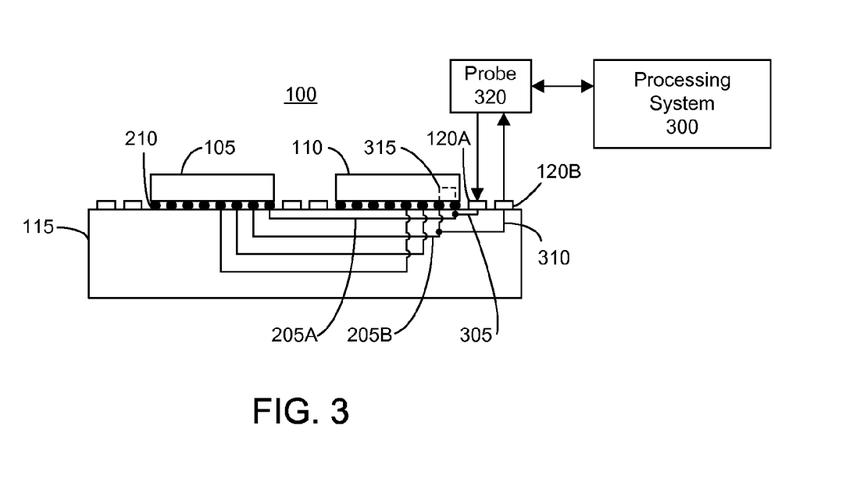
FIG. 3 is a second cross-sectional side view of a multi-die IC in accordance with one or more other embodiments disclosed within this specification.

FIG. 3 is a second cross-sectional side view of a multi-die IC in accordance with one or more other embodiments disclosed within this specification. FIG. 3 illustrates a test example in which one or more of probe pads 120 of multi-die IC 100 are coupled to inter-die wires 205 to facilitate testing of inter-die connections. FIG. 3 illustrates a test case in which die 105, die 110, and interposer 115 each is a known good die, or fault free. Die 105 and die 110 can be diced and mounted upon interposer 115. Interposer 115 can exist in wafer form. Alternatively, interposer 115 can be diced.

As shown, probe pad 120A can be coupled to inter-die wire 205A via pad coupling circuitry 305. Probe pad 120B can be coupled to inter-die wire 205B via pad coupling circuitry 310. Depending upon whether interposer 115 is implemented as a passive structure or an active structure, pad coupling circuitry 305 and pad coupling circuitry 310 can be implemented as passive structures, e.g., wires, capacitors, and/or the like, or as a combination of passive and active structures, e.g., one or more switches that selectively couple probe pads to the target inter-die wire.

FIG. 3 illustrates a test case in which micro-bumps 210 that bond and communicatively link die 110 to interposer 115 are tested. Die 110 can be configured to form an internal connection 315 between inter-die wire 205A and inter-die wire 205B.

In one or more embodiments, for example, in the case where die 110 is implemented as a programmable IC, configuration data can be loaded into die 110 to instantiate or form connection 315 using the programmable circuitry available within the programmable IC. Implementing connection 315 using programmable circuitry can entail utilization of significant physical wires, transistors, nets, and micro-bumps. Different configuration memory will enable different sets of programmable connections.

Though one internal connection is illustrated, it should be appreciated that the loading of configuration data within one or both of dies 105 and 110 can implement a plurality of internal connections to facilitate the testing of many inter-die connections while utilizing a minimum of probe pads 120, e.g., two. This type of approach, e.g., maximizing the connections while minimizing usage of probe pads 120, requires fewer test patterns due to the increased number of micro-bumps that are tested for a given set of configuration data and the corresponding programmable nets that are created. In one or more other embodiments, however, internal connection 315 can be fixed as opposed to being implemented using programmable circuitry requiring the loading of configuration data.

A probe 320 can output a test signal, e.g., a test vector, to probe pad 120A. Probe 320 can monitor probe pad 120B to determine whether the test signal is received. When the test signal is received through probe pad 120B, the inter-die connection between die 110 and interposer 115, at least with respect to the particular micro-bumps that couple to inter-die wire 205A and inter-die wire 205B to die 110, can be determined to be fault free. The process can be repeated to test further inter-die connections between die 105 and interposer 115 and between die 110 and interposer 115. In one or more embodiments, different pairs of micro-bumps can be tested sequentially until all, or substantially all, micro-bumps that couple die 105 and die 110 to interposer 115 are tested.

Within this specification, reference is made to a probe that can provide test signals and monitor for the receipt of the test signals provided as output from the particular device under test. It should be appreciated that the probe can be part of a larger IC testing system. The IC testing system can include a processing system that can control probe 320 to implement the various test functions described herein. In one or more embodiments, the processing system can be implemented as a computer system or any other data processing system that can execute programmatic instructions. Using probe 320 in combination with the processing system and any other components, e.g., IC handling subsystems, of the IC testing system, faulty inter-die connections can be identified and multi-die ICs having faulty inter-die connections can be tagged or otherwise identified.

Figure 4:
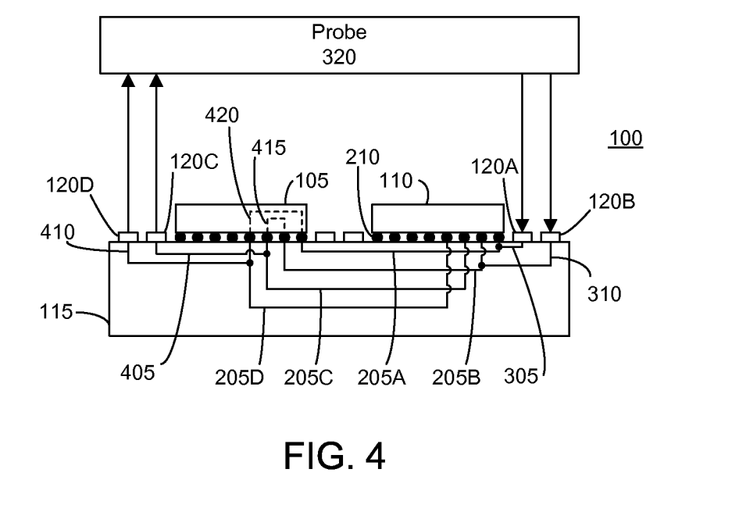
FIG. 4 is a third cross-sectional side view of a multi-die IC in accordance with one or more other embodiments disclosed within this specification.

FIG. 4 is a third cross-sectional side view of a multi-die IC in accordance with one or more other embodiments disclosed within this specification. FIG. 4 illustrates another test example in which one or more of probe pads 120 of multi-die IC 100 are coupled to inter-die wires 205 to facilitate testing of inter-die connections.

FIG. 4 illustrates a test case in which die 105, die 110, and interposer 115 each is a known good die. Die 105 and die 110 can be diced and mounted upon interposer 115. Interposer 115 can exist in wafer form or can be diced.

As shown, probe pad 120A can be coupled to inter-die wire 205A via pad coupling circuitry 305. Probe pad 120B can be coupled to inter-die wire 205B via pad coupling circuitry 310. Depending upon whether interposer 115 is implemented as a passive structure or an active structure, coupling circuitry 305 and 310 can be implemented as passive structures or a combination of passive and active structures. Probe pad 120C can be coupled to inter-die wire 205C via pad coupling circuitry 405. Probe pad 120D can be coupled to inter-die wire 205D via pad coupling circuitry 410.

Die 105 can be configured to implement internal connections 415 and 420. Internal connection 415 couples inter-die wire 205B to inter-die wire 205C within die 105. Internal connection 420 couples inter-die wire 205A to inter-die wire 205D within die 105. Accordingly, probe 320 can output a test signal to probe pad 120A. The test signal can propagate through probe coupling circuitry 305 to inter-die wire 205A, through micro-bump(s) coupling inter-die wire 205A to die 105, through internal connection 420, through micro-bump(s) coupling die 110 to inter-die wire 205D, through probe coupling circuitry 410 to probe pad 120D. When probe 320 detects the test signal on probe pad 120D, the described signal path can be determined to be fault free. Thus, micro-bumps 210 that couple inter-die wires 205A and 205D to die 105 can be determined to be fault free.

Similarly, probe 320 can output a test signal to probe pad 120B. The test signal can propagate through probe coupling circuitry 310 to inter-die wire 205B, through micro-bumps coupling inter-die wire 205B to die 105, through internal connection 415 and micro-bump(s) coupling die 105 to inter-die wire 205C, to pad coupling circuitry 405 to probe pad 120C. When probe 320 detects the test signal on probe pad 120C, the described signal path can be determined to be fault free. Accordingly, micro-bumps 210 that couple inter-die wires 205B and 205C to die 105 can be determined to be fault free.

Figure 5:
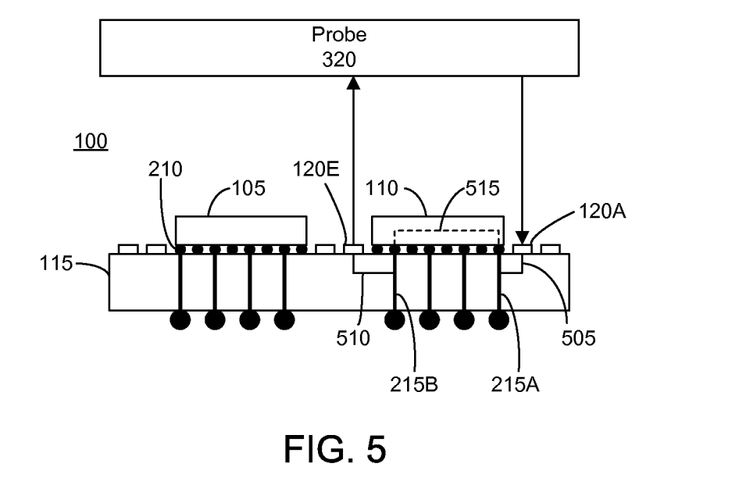
FIG. 5 is a fourth cross-sectional side view of a multi-die IC in accordance with one or more other embodiments disclosed within this specification.

FIG. 5 is a fourth cross-sectional side view of a multi-die IC in accordance with one or more other embodiments disclosed within this specification. FIG. 5 illustrates another test example in which one or more of probe pads 120 of multi-die IC 100 are coupled to TSVs 215 to facilitate testing of inter-die connections. FIG. 5 illustrates a test case in which die 105, die 110, and interposer 115 each is a known good die. Die 105 and die 110 can be diced and mounted upon interposer 115. Interposer 115 can exist in wafer form or can be diced.

As shown, probe pad 120A can be coupled to TSV 215A via pad coupling circuitry 505. Probe pad 120E can be coupled to TSV 215B via pad coupling circuitry 510. Depending upon whether interposer 115 is implemented as a passive structure or an active structure, pad coupling circuitry 505 and 510 can be implemented as passive structures or a combination of passive and active structures.

Die 110 can be configured to implement internal connection 515. Internal connection 515 couples TSV 215A to TSV 215B via micro-bumps 210. Accordingly, probe 320 can output a test signal to probe pad 120A. The test signal can propagate through pad coupling circuitry 505 to TSV 215A, through micro-bump(s) coupling TSV 215A to die 110, through internal connection 515 and micro-bump(s) 210 coupling die 110 to TSV 215B, and through pad coupling circuitry 510 to probe pad 120E. When probe 320 detects the test signal on probe pad 120E, the described signal path can be determined to be fault free. It should be appreciated that successfully testing the aforementioned signal path requires micro-bump(s) coupling die 110 to TSVs 215A and 215B to be fault free.

Figure 6:
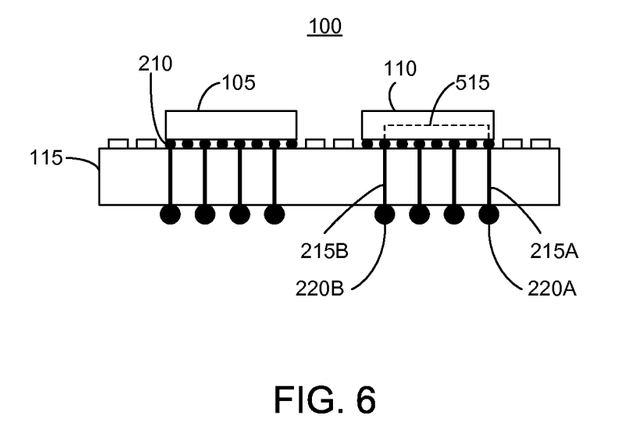
FIG. 6 is a fifth cross-sectional side view of a multi-die IC in accordance with one or more other embodiments disclosed within this specification.

FIG. 6 is a fifth cross-sectional side view of a multi-die IC in accordance with one or more other embodiments disclosed within this specification. FIG. 6 illustrates another test example in which inter-die connections are tested by probing package bumps 220 of multi-die IC 100. FIG. 6 illustrates a test case in which die 105, die 110, and interposer 115 each is a known good die. Die 105 and die 110 can be diced and mounted upon interposer 115. Interposer 115 can exist in wafer form or can be diced.

For ease of illustration, the probe is not shown within FIG. 6. In any case, die 110 can be configured to implement internal connection 515. Internal connection 515 can couple TSV 215A to TSV 215B through micro-bumps 210. Accordingly, a test signal can be output to package bump 220A, or alternatively, to the pad of interposer 115 beneath package bump 220A in the event package bumps have not yet been formed. The test signal can propagate through TSV 215A, micro-bump(s) 210 that couple die 110 to TSV 215A, through internal connection 515, out through micro-bump(s) 210 that couple die 110 to TSV 215B, and through TSV 215B. The probe can determine whether the test signal is received by probing either the pad beneath package bump 220B or package bump 220B if formed. When the probe detects the test signal being output from multi-die IC 100 via TSV 215B, the described signal path can be determined to be fault free.

Figure 7:
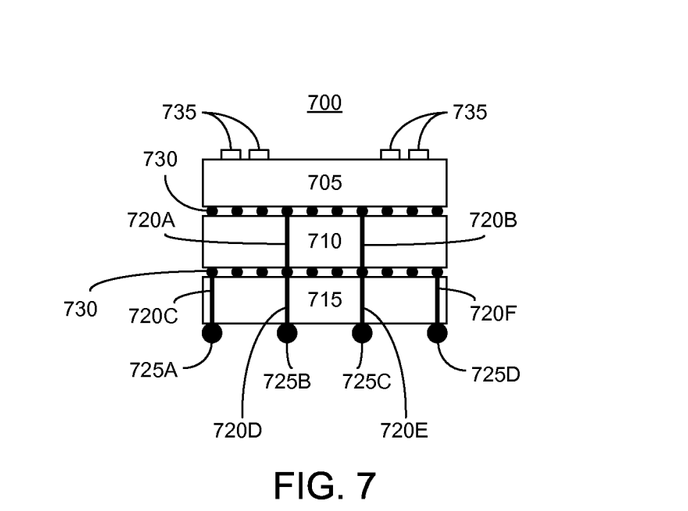
FIG. 7 is a sixth cross-sectional side view of a multi-die IC in accordance with one or more other embodiments disclosed within this specification.

FIG. 7 is a sixth cross-sectional side view of a multi-die IC 700 in accordance with one or more other embodiments disclosed within this specification. FIG. 7 illustrates a stacked die configuration in which three or more dies, e.g., die 705, die 710, and die 715, can be vertically stacked. Rather than using a die as a dedicated transport mechanism, e.g., an interposer, to convey signals among two or more dies, the dies can be stacked vertically as shown so that no pair of dies is on a same horizontal plane as was the case with multi-die IC 100. Rather, each of dies 705-715 is on a unique horizontal plane.

Within multi-die IC 700, inter-die signals can be conveyed through the use of a plurality of TSVs. Each die, with the exception of the top die, e.g., 705, can include one or more TSVs 720. Die 710 can include TSV 720A and TSV 720B. Die 715 can include TSVs 720C, 720D, 720E, and 720F. Multi-die IC 700 can include a plurality of package bumps 725A-725D. Dies 705, 710, and 715 can be coupled via a plurality of micro-bumps 730 substantially as described within this specification.

With this configuration, die 705 can communicate with die 710 via one or more micro-bumps 730 coupling die 705 and die 710. Similarly, die 710 can communicate with die 715 via one or more of micro-bumps 730 coupling die 710 to die 715. Die 705 can communicate directly with die 715 through signals passed via micro-bump(s) 730 coupling die 705 to TSV 720A and/or TSV 720B and through micro-bump(s) coupling TSV 720A and/or TSV 720B.

In one or more embodiments, die 705 can be coupled to package bump 725B and/or 725C via micro-bump(s) 730 coupling die 705 to TSV 720A and/or TSV 720B, micro-bump(s) 730 coupling TSV 720A to TSV 720D and/or micro-bump(s) 730 coupling TSV 720B to TSV 720E. Similarly, die 710 can be coupled to package bumps 725A-725D via micro-bump(s) 730 coupling die 710 to TSVs 720C-720F respectively.

It should be appreciated that the number of micro-bumps, TSVs, and package-bumps illustrated within FIGS. 1-7 are provided for purposes of illustration only and are not intended to be limiting or to suggest a particular number of the aforementioned circuit structures. Regarding FIG. 7, for example, die 705 can be coupled to package bumps, to die 710, as well as to die 715 using any combination of the different connections described. With each of dies 705-715 being larger in size, thousands of micro-bumps, for example, can be used to form inter-die connections.

In testing the inter-die connections of multi-die IC 700, package bumps 725 (or the pads beneath package bumps 725) can be probed as described with reference to FIG. 6. Die 715, die 710, and/or die 705 can be configured to form one or more internal connections to route any received test signals back out so that a probe can determine whether the signal path inclusive of any intervening micro-bumps 730 and/or TSVs 720 is fault free.

In one or more embodiments, probe pads 735 can be disposed on top of die 705. Each probe pad 735 can be coupled to, for example, an internal node of die 705 that can, through proper configuration of die 705, be coupled to any one of micro-bumps 730 disposed between die 705 and die 710. Accordingly, a combination of probing package bumps 725 (or the pads disposed beneath the package bumps 725 when not yet formed) and probe pads 735 can be implemented to test different inter-die connections. As an example, a signal path from package bump 725D to TSV 720F, through an internal connection within die 710, to TSV 720E to package bump 725C can be tested. In another example, a signal path from a probe pad 735 through die 705 to TSVs 720A and 720D, to package bump 725B can be tested. As noted, the pads beneath each respective package bump can be probed in the event the package bump has not yet been formed.

Figure 8:
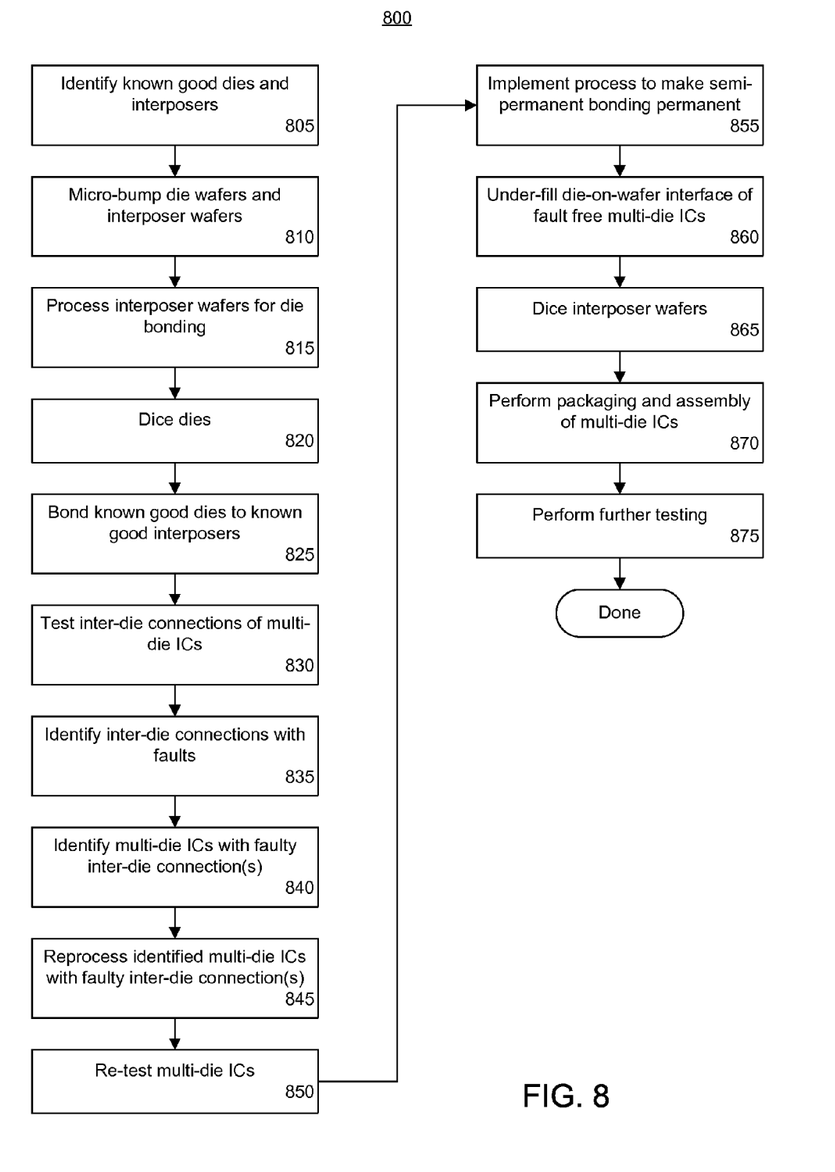
FIG. 8 is a flow chart illustrating a method of testing inter-die connections within a multi-die IC in accordance with one or more other embodiments disclosed within this specification.

FIG. 8 is a flow chart illustrating a method 800 of testing inter-die connections within a multi-die IC in accordance with one or more other embodiments disclosed within this specification. Method 800 can be implemented using an IC testing system that can perform the various functions described within this specification. For example, the IC testing system can probe various probe pads disposed on the dies and/or interposer of the multi-die ICs undergoing testing, determine whether conductive paths are fault free according to test vectors provided and received out of the device under test, and track those particular dies and/or multi-die ICs for which faults have been identified.

In step 805, the system can identify known good dies and interposers. The dies and interposers, while still in wafer form, can be tested. Dies and interposers, for example, can be tested under different operating conditions to detect open circuits, close circuits, or the like. For example, test circuit designs can be instantiated within the dies. Test signals can be provided to the dies. The output from each die can be compared with expected output to determine whether the actual output matches the expected output indicating a fault free state. From this sort of testing, known good dies and known good interposers can be identified.

In step 810, the die wafers and interposer wafers can be micro-bumped. The dies and interposers can undergo a bump formation process where micro-bumps are formed on exposed pads of the dies and exposed pads of the interposers. It should be appreciated that, in some cases, testing of dies and/or interposers can be performed subsequent to micro-bumping. In step 815, interposer wafers can be processed for die bonding. For example, interposer wafers may have been thinned as part of the manufacturing process to expose TSVs on the top and on the bottom surfaces. Accordingly, the interposer wafers can be mounted to a carrier facilitate the bonding of dies. In step 820, the dies can be diced, e.g., separated into individual dies. The interposers can remain in wafer form.

In step 825, known good dies can be bonded to known good interposers. In one or more embodiments, a semi-permanent bonding process can be used where dies are bonded by aligning micro-bumps on the bottom of the dies with micro-bumps on the top of the interposers. The bottom of each die can be placed on top of the top surface of the interposer using the correct alignment, i.e., where each micro-bump of the die is aligned with the intended or correct micro-bump of the interposer. A semi-permanent bonding process that causes the micro-bumps to reflow. The reflow process effectively causes each pair of micro-bumps to form a single micro-bump, thereby bonding the dies to the interposers.

In step 830, the system can test inter-die connections. Inter-die connections can be tested using any of the various testing techniques described within this specification. The inter-die connections can be tested for faults. For example, inter-die connections including only micro-bumps can be tested. Inter-die connections including both micro-bumps and TSVs can be tested. Various combinations of inter-die connections can be tested. In step 835, the system can identify the inter-die connections with faults. The system can determine which of the inter-die connections experienced a fault during the testing. In step 840, responsive to detecting a fault in an inter-die connection, each multi-die IC determined to include a faulty inter-die connection can be identified, or otherwise designated, as including a faulty inter-die connection.

In step 845, multi-die ICs with faulty inter-die connections can be reprocessed. Reprocessing can be available in selected IC manufacturing technologies such as semi-permanent process technologies as described with reference to step 825. For example, faulty inter-die connections, i.e., micro-bumps, can be reflowed. In step 850, the multi-die ICs that were reprocessed can be retested. In step 855, an IC processing step can be implemented to make any semi-permanent bonds between dies and interposer permanent for those multi-die ICs that are determined to be fault free, whether reprocessed or not. For example, a process such as thermo-compression bonding can be implemented to make semi-permanent inter-die connections permanent.

In step 860, those multi-die ICs that do not have faulty inter-die connections, whether reworked or not, can undergo an under-fill process. The under-fill process under-fills the die-on-wafer interface of fault-free multi-die ICs. The under-fill process can add strength to the die-on-wafer bonding achieved via the micro-bumps. In step 865, interposer wafers can be diced to form a plurality of separate multi-die ICs. Prior to step 865, for example, while the multi-die ICs are formed, the multi-die ICs are not separate and distinct since the interposers are still in wafer form.

In step 870, packaging and assembly of the multi-die ICs can be performed. It should be appreciated that only those multi-die ICs formed of known good dies and known good interposers that have been identified as having no inter-die connection faults are packaged. In step 875, further testing of each multi-die IC in package form can be performed.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The flowchart in the figures illustrates the architecture, functionality, and operation of possible implementations of systems, methods and computer program products according to one or more embodiments disclosed within this specification. In this regard, each block in the flowchart may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a computer-usable or computer-readable medium, storing program code that, when loaded and executed in a system having memory and a processor, causes the system to perform at least a portion of the functions described within this specification. Examples of data storage media can include, but are not limited to, optical media, magnetic media, magneto-optical media, computer memory such as random access memory or hard disk(s), or the like.

The terms and/or phrases "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of testing a multi-die integrated circuit, the method comprising:
    testing an inter-die connection of the multi-die integrated circuit, wherein the inter-die connection comprises a bump coupling a first die to a second die;
    wherein the first die is bonded to the second die using a semi-permanent bonding technique;
    wherein the testing the inter-die connection includes:
        providing a first probe pad disposed on the second die, wherein the first probe pad is coupled to a first bump coupling the first die to the second die;
        providing a second probe pad disposed on the second die, wherein the second probe pad is coupled to a second bump coupling the first die to the second die; and
        loading configuration data into configuration memory cells in the first die, wherein the configuration memory cells having the configuration data establish an internal connection in the first die, coupling the first bump to the second bump;
    detecting whether a fault occurs during testing of the inter-die connection;
    responsive to detecting the fault, designating the multi-die integrated circuit as including a faulty inter-die connection; and
    re-processing, when the multi-die integrated circuit is designated as including a faulty inter-die connection, the inter-die connection.

2. The method of claim 1, further comprising:
    selecting the second die to be an interposer consisting essentially of at least one passive metal layer.

3. The method of claim 1, wherein detecting whether a fault occurs comprises:
    determining whether a test signal propagates from the first probe pad to the second probe pad.

4. The method of claim 1, wherein testing the inter-die connection comprises:
    disposing the first die on the second die, wherein the second die comprises a first through silicon via (TSV) coupled to the first die through a first bump and a second TSV coupled to the first die through a second bump; and
    within the first die, establishing an internal connection coupling the first bump to the second bump.

5. The method of claim 4, wherein detecting whether a fault occurs comprises:
    determining whether a test signal provided to the first TSV propagates to the second TSV.

6. The method of claim 5, wherein:
    the first TSV is coupled to the first bump at a first end of the first TSV and is coupled to a first package bump at a second end of the first TSV;
    the second TSV is coupled to the second bump at a first end of the second TSV and is coupled to a second package bump at a second end of the second TSV; and
    detecting whether a fault occurs further comprises determining whether a test signal provided to the first package bump propagates to the second package bump.

7. The method of claim 4, wherein the first probe pad is coupled to the first TSV and the second probe pad is coupled to the second TSV.

8. The method of claim 1, wherein the first probe pad is coupled to a first bump, wherein testing the inter-die connection further comprises:
    providing a through silicon via (TSV) within the second die, wherein a first end of the TSV couples to a second bump; and
    within the first die, establishing an internal connection coupling the first bump to the second bump.

9. The method of claim 8, wherein detecting whether a fault occurs comprises:
    determining whether a test signal propagates from the first probe pad to the TSV.

10. An integrated circuit, comprising:
    a first die;

a second die, wherein the first die is disposed on the second die;

wherein the second die comprises a silicon interposer including a plurality of inter-die wires;

a third die disposed on the second die;

wherein a selected inter-die wire couples a first inter-die connection between the first die and the second die and a second inter-die connection between the third die and the second die;

wherein the first die and the third die are in substantially a same horizontal plane;

a plurality of inter-die connections coupling the first die to the second die and the third die to the second die; and a plurality of probe pads, wherein each probe pad is coupled to at least one of the inter-die connections, wherein at least one of the plurality of probe pads is located between the first die and the third die;

wherein the first die and the third die each comprise internal connections that are programmable to couple inter-die connections, and programmable circuit elements of the internal connection are re-programmable for operation within a user design within the first die and the third die;

wherein a signal path is formed from a first of the plurality of probe pads to a second of the plurality of probe pads using the selected inter-die wire, an internal connection programmed within each of the first die and the third die, the first inter-die connection, and the second inter-die connection; and wherein the first die and the third die are semi-permanently bonded to the second die.

11. A method of testing a multi-die integrated circuit, the method comprising:

bonding a first die to a second die using a semi-permanent bonding technique;

testing an inter-die connection of the multi-die integrated circuit, wherein the inter-die connection comprises a first bump coupling the first die to the second die;

wherein testing the inter-die connection comprises:
  disposing the first die on the second die, wherein the second die comprises a first through silicon via (TSV) coupled to the first die through the first bump and a second TSV coupled to the first die through a second bump; and
  within the first die, establishing an internal connection coupling the first bump to the second bump;

detecting whether a fault occurs during testing of the inter-die connection; and responsive to detecting the fault, re-processing the inter-die connection.

12. The method of claim 11, wherein the testing the inter-die connection comprises:

providing a first probe pad disposed on the second die, wherein the first probe pad is coupled to the first bump coupling the first die to the second die;

providing a second probe pad disposed on the second die, wherein the second probe pad is coupled to a second bump coupling the first die to the second die; and loading configuration data into configuration memory cells in the first die, wherein the configuration memory cells having the configuration data establish an internal connection in the first die, coupling the first bump to the second bump.

13. The method of claim 11, wherein detecting whether a fault occurs comprises:

determining whether a test signal provided to the first TSV propagates to the second TSV.

14. The method of claim 13 wherein:

the first TSV is coupled to the first bump at a first end of the first TSV and is coupled to a first package bump at a second end of the first TSV;

the second TSV is coupled to the second bump at a first end of the second TSV and is coupled to a second package bump at a second end of the second TSV; and detecting whether a fault occurs further comprises determining whether a test signal provided to the first package bump propagates to the second package bump.

15. The method of claim 11, wherein testing the inter-die connection further comprises:

providing a first probe pad and a second probe pad disposed on the second die, wherein the first probe pad is coupled to the first TSV and the second probe pad is coupled to the second TSV.

16. The method of claim 11, wherein testing the inter-die connection further comprises:

providing a first probe pad disposed on the second die, wherein the first probe pad is coupled to the first bump;

providing a through silicon via (TSV) within the second die, wherein a first end of the TSV couples to a second bump; and within the first die, establishing an internal connection coupling the first bump to the second bump.

* * * * *